United States Patent [19]
Suh

[11] Patent Number: 5,754,488
[45] Date of Patent: May 19, 1998

[54] APPARATUS AND METHOD FOR CONTROLLING A BIT LINE SENSE AMPLIFIER HAVING OFFSET COMPENSATION

[75] Inventor: Jeung Won Suh, Kyoungkido, Rep. of Korea

[73] Assignee: Hyundai Electronics Industries Co., Ltd., Kyoungkido, Rep. of Korea

[21] Appl. No.: 744,806

[22] Filed: Nov. 6, 1996

[51] Int. Cl.$^6$ .................................................... G11C 7/00
[52] U.S. Cl. ........................ 365/205; 365/149; 365/189.01
[58] Field of Search ..................................... 365/205, 149, 365/189.01

[56] References Cited

U.S. PATENT DOCUMENTS 5,426,603  6/1995  Nakamura et al. ................... 365/149
5,434,821  7/1995  Watanabe et al. ................... 365/203
5,436,866  7/1995  Jang ..................................... 365/208

*Primary Examiner*—David C. Nelms
*Assistant Examiner*—Hien Nguyen
*Attorney, Agent, or Firm*—Jacobson, Price, Holman & Stern, PLLC

[57] ABSTRACT

The present invention relates to an apparatus and method for controlling a bit line sense amplifier, comprising a first inverter for inverting data of a first bit line; a second inverter for inverting data of a second bit line; a first and a second switch responsive to an output signal from a column decoder for switching between an output terminal of the first and the second inverter and a data bus, respectively; a third and a fourth switch responsive to an offset compensation signal for switching between an input terminal and an output terminal of the first inverter and the second inverter, respectively; and an offset compensation signal generator for generating an offset compensation signal in accordance with a row control signal.

20 Claims, 9 Drawing Sheets

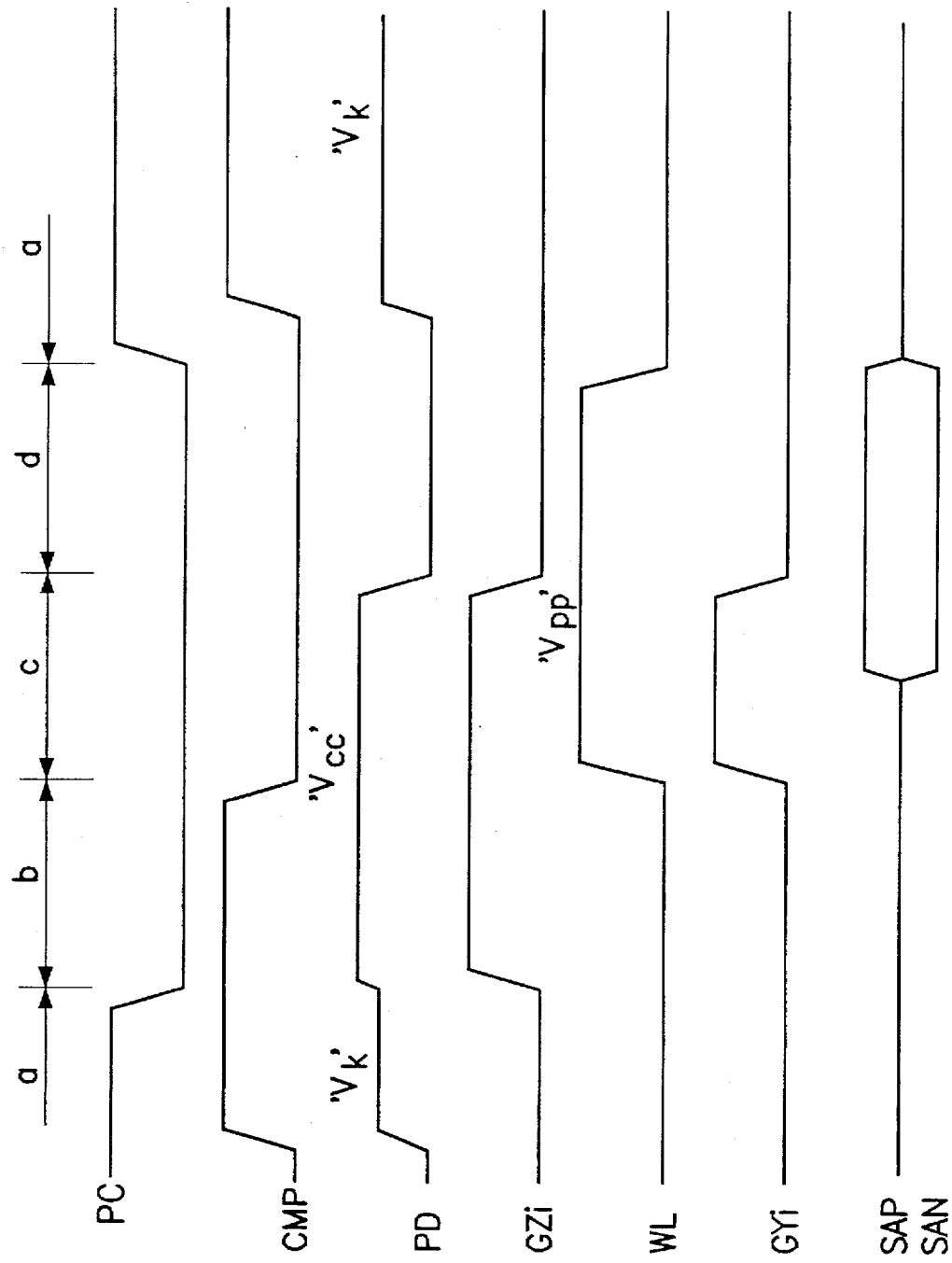

APPARATUS AND METHOD FOR CONTROLLING A BIT LINE SENSE AMPLIFIER HAVING OFFSET COMPENSATION

BACKGROUND OF THE INVENTION

1. Field of the Invention

The present invention relates to an apparatus and method for controlling a bit line sense amplifier, and more specifically relates to a bit line sense amplifier having offset compensation and method for controlling the same.

2. Description of the Prior Art

In general, scaled-down of the MOS(Metal Oxide Semiconductor) transistor provides memory with large integration and reduction of the access time. It is expected that 1 Gbyte DRAM(Dynamic Random will be used commonly within the few years, namely by the year 2002.

It is also expected that a 0.18 µm transistor will be used in a 1 Gbyte DRAM cell, and a 0.13 µm transistor in a 4 Gbyte DRAM cell, and a Deep Submicron MOS transistor will be used in a sense amplifier of a giga bit memory. A bit line sense amplifier uses circuits comprising symmetry transistor(for example, circuit comprising differential amplifier or dynamic CMOS latch) for fast amplifying small voltage difference between bit line BL and bit bar line /BL. As it uses shorter channel transitor, mismatch of threshold voltage $V_T$ and transconductance $G_M$ between transistors increase because of change in the processing.

The offset from mismatch reduces the sensibility of the sense amplifier, which results in not only a reduction of the sense speed but also a wrong operation. Since there are a plurality of bit line sense amplifiers in a giga bit DRAM, the condition of worst case should be strictly limited. The strict condition prevents sense amplifiers from wrong operation. For example, it will be used more $2 \times 10_6$ bit line sense amplifier in a 1 Gbit DRAM. Furthermore, sense operation should be performed on the more $6\sigma$ change condition in mismatch distribution of $V_T$ and $G_m$. $\sigma$ is the standard deviation of the mismatch distribution.

There must be an offset of a sense amplifier from a transistor mismatch in the giga bit DRAM, therefore it must needs a solution in the circuit.

The operation speed of a DRAM is less developed than the increment of integration. However, high speed operation of the DRAM is important. For high speed operation of a DRAM, a sense operation should be performed at a high speed. A bit line sense amplifier of a dynamic CMOS latch is generally used in a megabit DRAM because of its simplicity and the high sensitivity of its signals.

However, mismatch of symmetry transistors makes the sensitivity low, and it needs enough timing margin for a stable sense operation of the DRAM.

A direct sense amplifier using a differential amplifier is generally applied to a 64 Mbit and 256 Mbit DRAM, which was developed recently.

FIG. 1 shows a circuit diagram of a conventional direct bit line sense amplifier. In this figure, the reference numeral NA1 through NA9 designate NMOS transistors, BL and /BL bit lines, SAN and SAP control signal of regeneration amplifier, GYi output of a column decoder, GWi output of a write column decoder, PC precharge control signal, and an HV half driving voltage, respectively.

The output of the word line WL and column decoder GYi is activated after the bit line is precharged to VCC/2 by transistors NA7, NA8 and NA9. The feeble voltage difference between bit lines is amplified by transistors NA1 and NA2 as cell data are transferred to the bit line. The amplified signal is transferred to the sense amplifier of the read data bus and then sensed. The control signals SAP and SAN are activated after cell data are transferred to the bit line, which rewrites data to the cells by operating a regeneration amplifier.

The direct sense amplifier performs a sense operation without the signal transfer time, which is the transfer time of the signal from cell to bit line.

The sensitivity of the direct sense amplifier is decreased and unstable by mismatch between transistors NA1 and NA2 which perform sensing. Therefore, there are a lot of problems in the direct sense amplifier of a giga bit DRAM.

SUMMARY OF THE INVENTION

Therefore, it is an object of the present invention to provide a bit line sense amplifier which compensates for the offset of the sense amplifier from mismatch between the transistors in the DRAM, and which performs stable operations in the worst case.

On the other hand, since it is sensed by race between symmetry transistors, the direct sense amplifier or a sense amplifier of CMOS latch is sensed by the offset of it.

In mostly used dynamic CMOS latch bit line sense amplifiers, there is a race between the cross-coupled transistors. Therefore, it needs a new sensing method without race. It is another object of the present invention to provide a bit line sense amplifier sensing without race.

According to an aspect of the present invention, there is provided an apparatus for controlling bit line of which sense amplifier have offset compensation, the apparatus comprising:

a first inverter for inverting data of a first bit line;

a second inverter for inverting data of a second bit line;

a first and a second switch responsive to an output signal from a column decoder for switching between an output terminal of the first and the second inverter and a data bus, respectively;

a third and a fourth switch responsive to an offset compensation signal for switching between an input terminal and an output terminal of the first inverter and the second inverter, respectively; and an offset compensation signal generator for generating an offset compensation signal in accordance with a row control signal.

According to another aspect of the present invention, there is provided an apparatus controlling bit line which has a regeneration amplifying means, the apparatus comprising:

a first inverter for inverting data from a first bit line;

a second inverter for inverting data from a second bit line;

a first and a second switch for between an output terminal of the first and the second inverter and selected data buses in accordance with an output signal of an outer column decoder; and a third and a fourth switch for switching between an input terminal and an output terminal of the first and the second inverter in accordance with an outer offset compensation signal.

According to the present invention, there is provided a method controlling bit line sense amplifier which has a first and a second inverter for inverting an output signal of a first and a second bit line; and a first and a second switch for switching between an input terminal and an output terminal of the first and the second inverter in accordance with offset compensation signal, the method comprising steps:

precharging the bit lines;

compensating offset by switching the first and the switch which switches the input terminal and the output terminal of the first and the second inverter respectively; and changing only voltage of which bit line is connected to the cells by activating word line, whereby any one of inverter performs amplifying operation, and the other inverter keeps input/output voltage after offset compensation.

BRIEF DESCRIPTION OF THE DRAWINGS

The above and other objects, features and advantages of the present invention will be more clearly understood from the following detailed description taken in conjunction with the accompanying drawings, in which:

FIG. 6 is a timing diagram illustrating principal signals of the bit line sense amplifier in accordance with the present invention when reading.

DETAILED DESCRIPTION OF THE INVENTION

Figure 1:
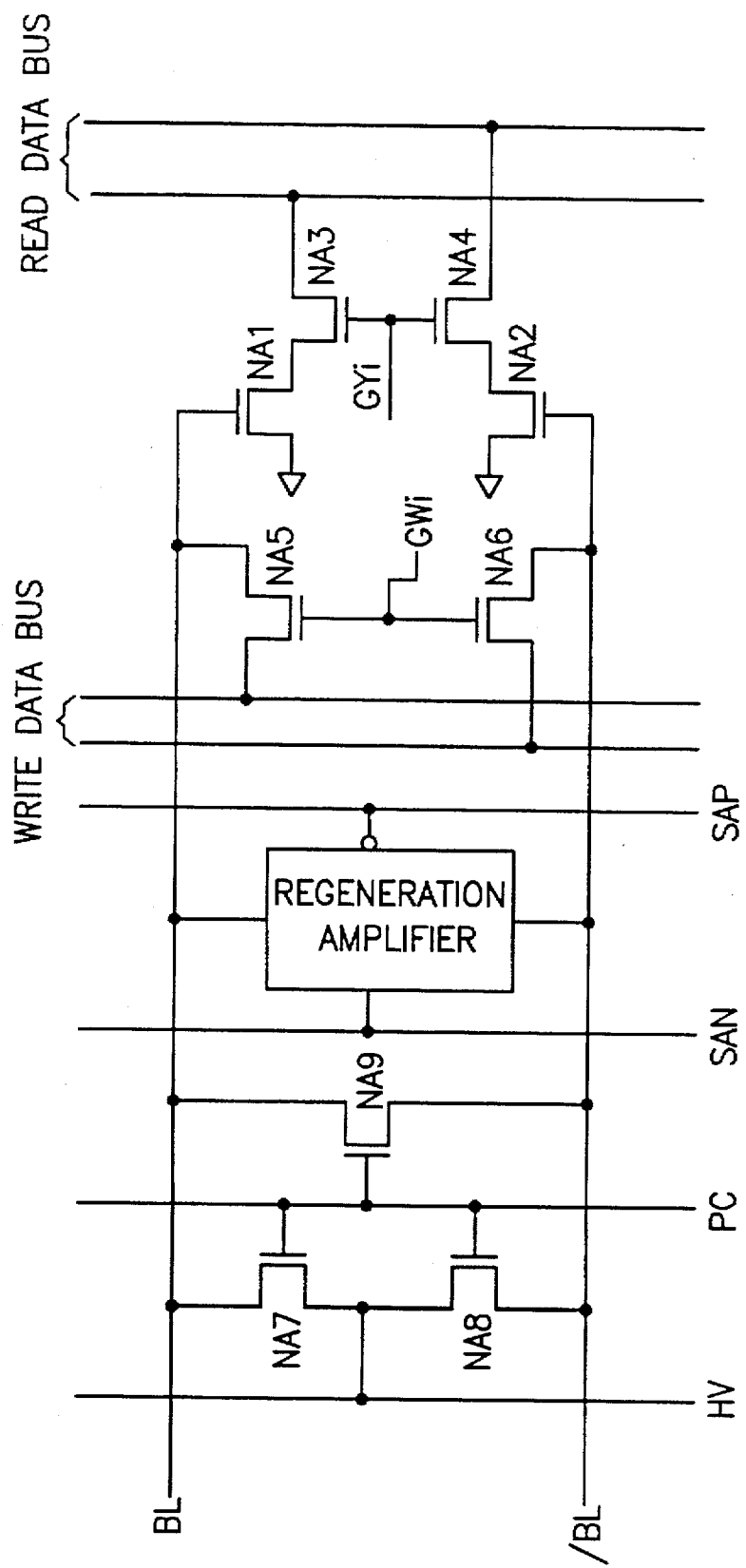
FIG. 1 is a circuit diagram of a conventional bit line sense amplifier.
Figure 2A:
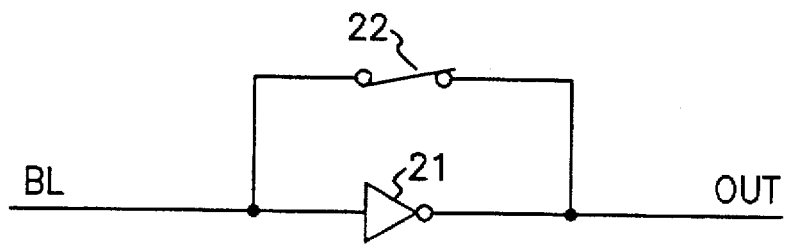
FIG. 2A is a diagram illustrating the basic principle of the invention.
Figure 2B:
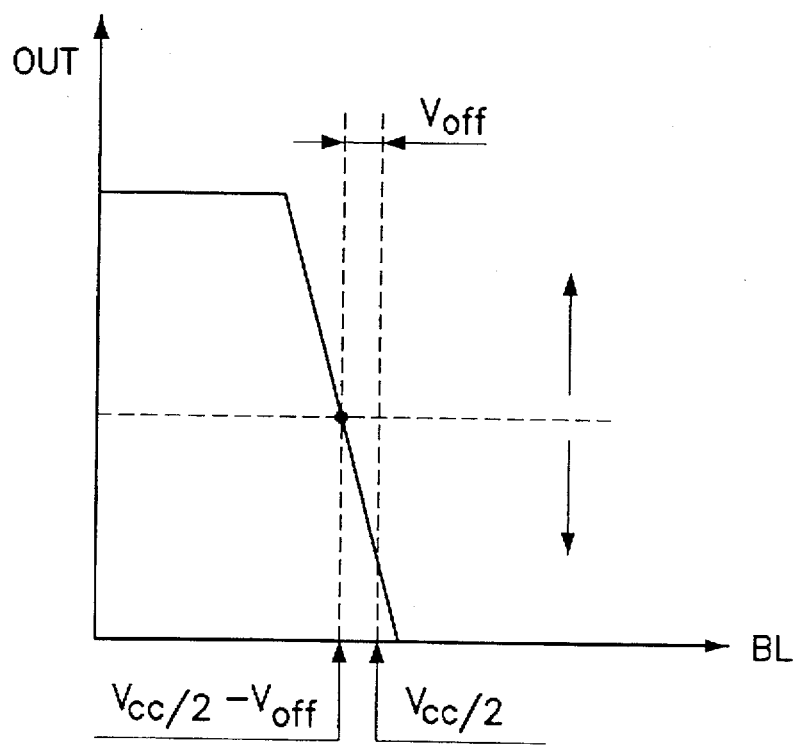
FIG. 2B is a graph illustrating the input and output transfer curve of the sense amplifier in FIG. 2A.

FIG. 2A is a diagram illustrating the basic principle of the invention. FIG. 2B shows the input and output transfer curve of the sense amplifier in FIG. 2A. The reference numeral 21 designates an inverter, and 22 a switch.

The input and output transfer curve of the inverter 21 is shown in FIG. 2B. When the input and output are connected by the switch 22, they are set at the largest amplification degree regardless of offset from change of transistor. The current of the PMOS transistor in the inverter 21 is the same as that of the NMOS in the inverter 21 on this condition. When the input is changed with $\Delta v$ after the switch 22 is off the transistor, the current difference is amplified as follows:

$$\Delta i = (G_{mN} + G_{mP})\Delta V$$

Where, $G_{mN}$ is a transfer conducting degree of the NMOS transistor, and $G_{mP}$ is that of the PMOS transistor.

The offset compensation principal of the inverter 21 is applied to the sense amplifier of the present invention.

Figure 3A:
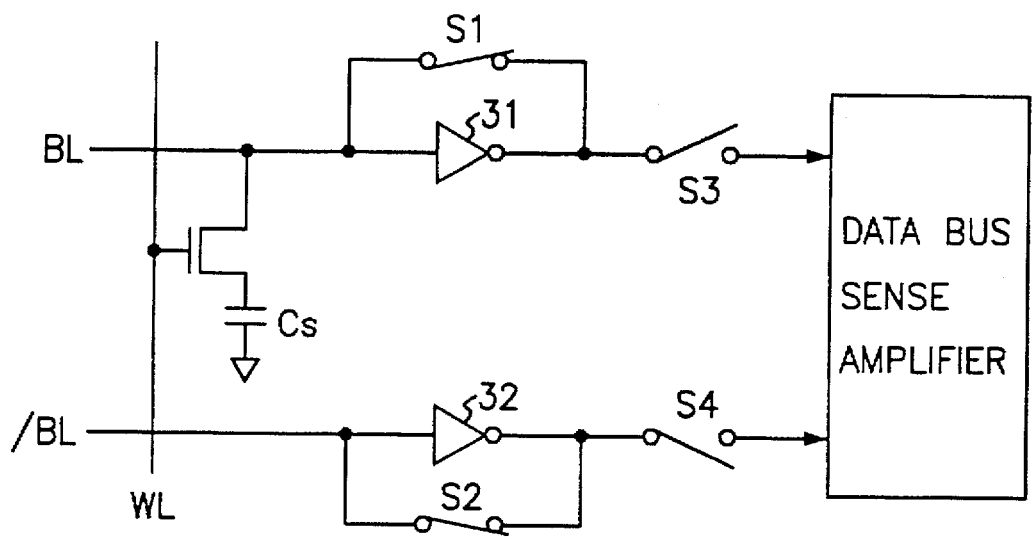
FIG. 3A and 3B are diagrams illustrating the basic principle of the bit line sense amplifier.
Figure 3B:
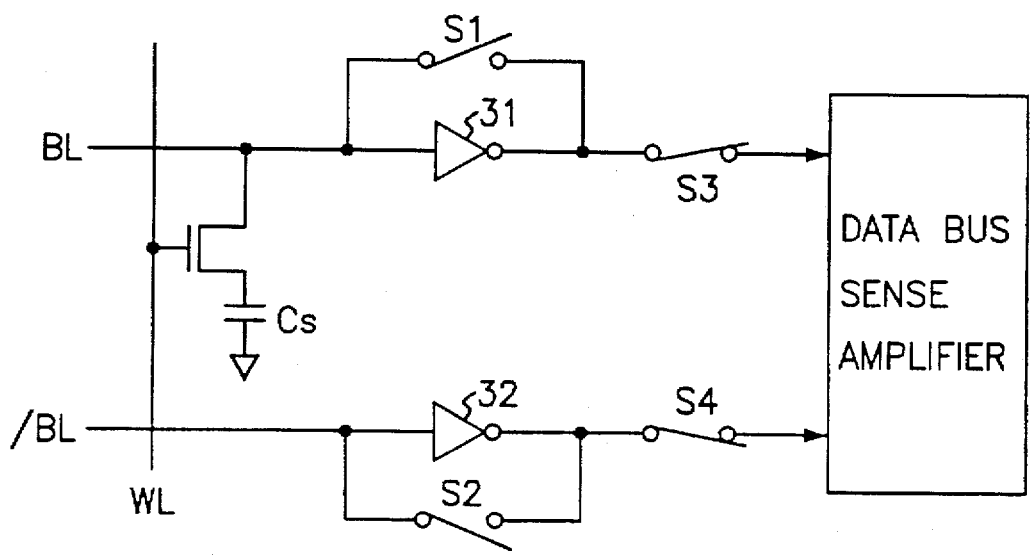

FIG. 3A and 3B illustrate the basic principle of the bit line sense amplifier.

FIG. 3A shows the offset compensation function of the present invention. Switches S1 and S2 become on while a word line WL is low, which compensates for the offset of each inverter 31 and 32.

FIG. 3B shows the sensing operation of the present invention. The switches S1 and S2 become off, and the switches S3 and S4 on after offset compensation, whereby the word line WL is active. Data on the cell capacitor Cs induces little voltage difference on the bit line BL, and the little induced signal is amplified by the inverter 31.

However, since there is no change of voltage on the bit bar line /BL which is the input voltage, the inverter 32 keeps input and output voltage after offset compensation.

Therefore, in the sense amplifier in accordance with the present invention, there is no race between transistors, thereby performing a stable operation in spite of the offset.

Figure 4:
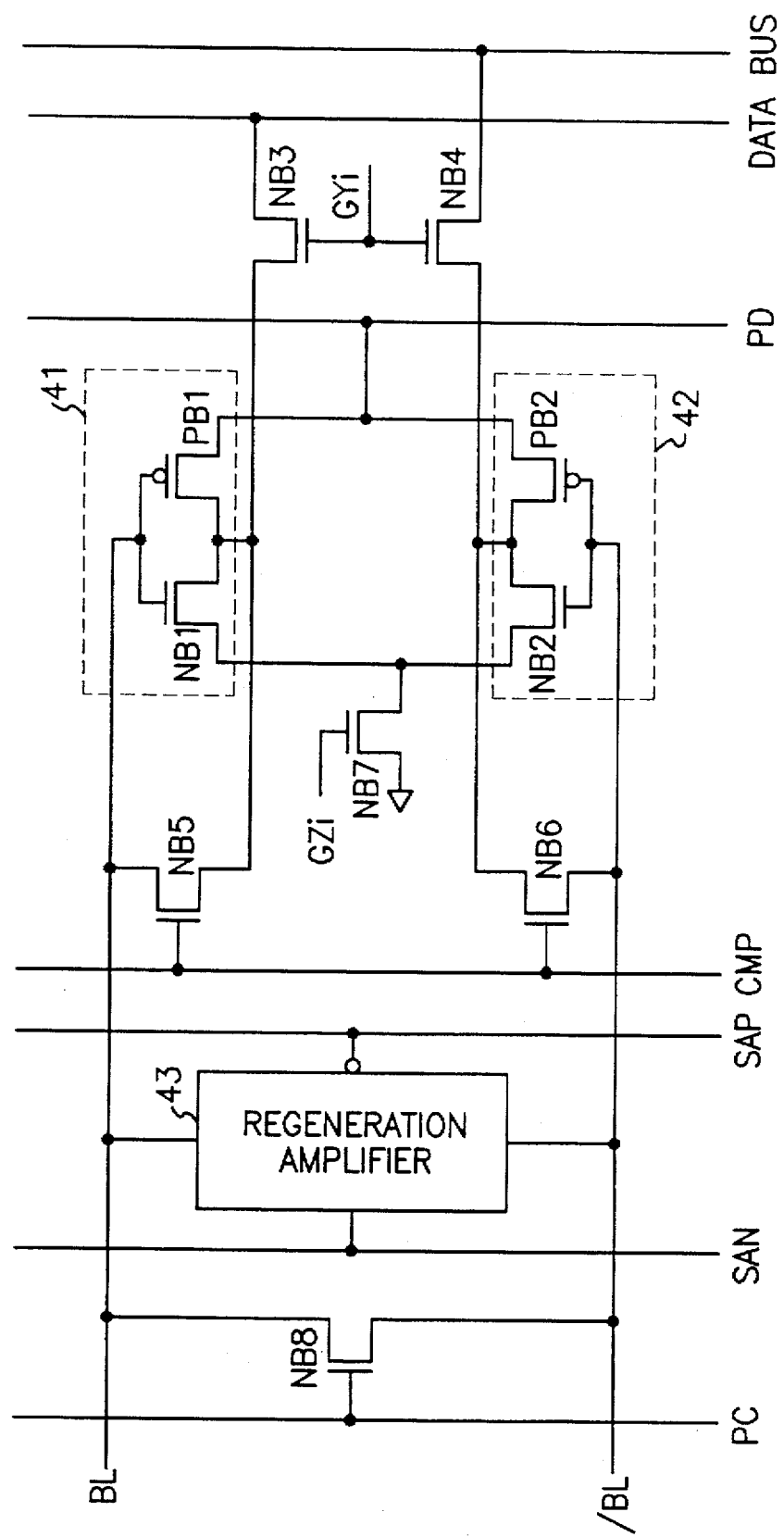
FIG. 4 is a circuit diagram of the bit line sense amplifier having offset compensation in accordance with the present invention.

FIG. 4 shows a bit line sense amplifier having an offset compensation in accordance with the present invention. The reference numerals PC, WL, GYi, SAP, and SAN are peculiar internal signals of DRAM, CMP, PD, and GZi which are new signals for performing the present invention.

The sense amplifier of the invention comprises the two inverters 41 and 42 having two transistors, respectively. Each inverter contains a pull-up transistor and a pull-down transistor. The bit line sense amplifier performs the offset compensation and sense amplifying.

GZi designates a pull-down control signal of the inverter in FIG. 4. GZi is high only when output of the column decoder GYi is active when reading data, thereby reducing power consumption in a whole inverter sense amplifier array. GZi is inactive on writing data, a pull-up driving signal PD is floating state, which makes inverters 41 and 42 inactive. However, the offset compensation signal CMP becomes active. Therefore, data can be transferred from the data bus to the bit line.

The bit line sense amplifier having an offset compensation in accordance with the present invention comprises new precharge circuits for reducing layout. The new precharge circuits are illustrated in FIG. 5.

Figure 5:
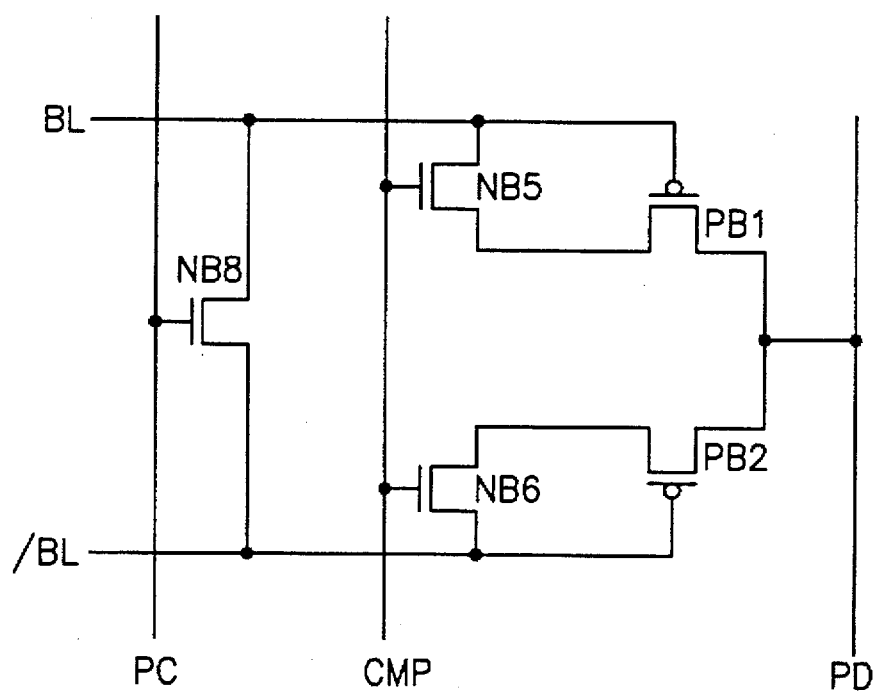
FIG. 5 is a circuit diagram of the precharge block which is applied to the present invention.

FIG. 5 shows the precharge block which is applied to the present invention.

When the transistors are changed into precharge condition after the retrieval of cell data in a DRAM, the bit lines BL and /BL are high and low, respectively. The precharge control signal PC makes transistor NB8 turn on, thereby making the voltages of the bit lines BL and /BL half driving voltage which is the voltage in the middle of high and low. CMP is activated and transistors PB1 and PB2 are connected as a form of a diode. The bit lines BL and /BL are precharged. For example, if $Vk-V_{CC}-V_T$, the bit lines precharged at a half driving voltage $V_{CC}/2$ by the mentioned method in the case of $V_{CC} \approx 4V_T$. Also, it is possible to be precharged by the conventional precharge circuits.

FIG. 6 illustrates timing of principal signals of the bit line sense amplifier in accordance with the present invention when reading data. The reference numeral $V_{PP}$ designates bootstripped voltage, $V_k$ voltage level of PD for precharge.

As illustrated in FIG. 6, the read operation includes precharge operation a, offset compensation operation b, sensing operation c, and restore operation d. When the PC is on, the signals of the bit line BL and the bit bar line /BL are changed to half voltage of high and low, and the bit lines are precharged at $V_k-V_T$ by CMP.

PD and GZi are activated at $V_{CC}$ and perform offset compensation, and the word lines WL and GYi are activated, thereby starting the sensing. The small voltage of the bit lines connected with cells is inducted, and the inducted signals are amplified by the inverter and transferred to the data bus sense amplifier.

Data is rewritten into the cell by the operation of the regeneration amplifier which is driven by SAP and SAN, after cell data is transferred to the bit lines. When cell data has been stored, the bit lines become precharged.

Figure 7A:
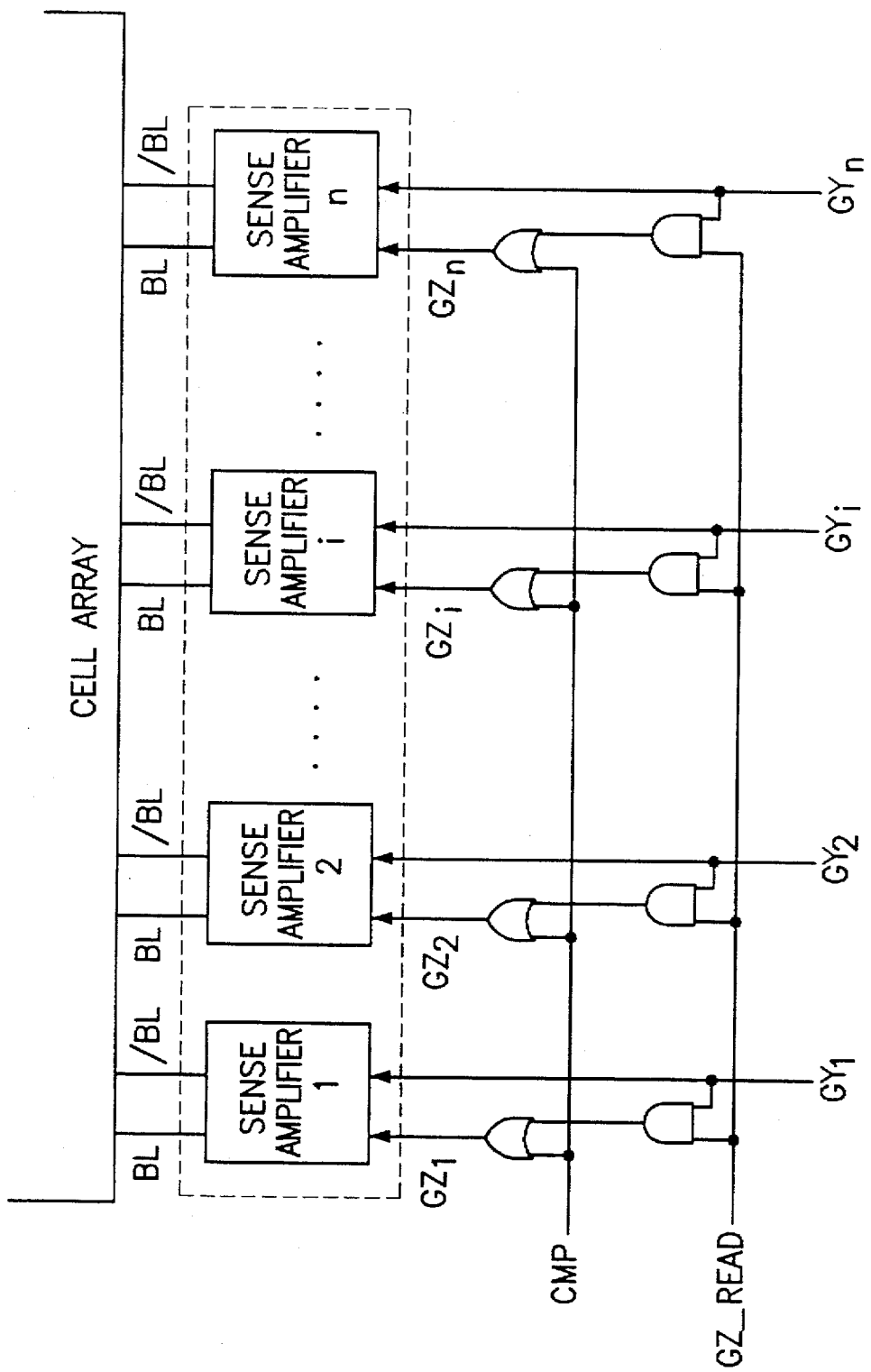
FIG. 7A is a circuit diagram of pull-down control signal GZi generating block.

FIG. 7A shows a circuit diagram of a pull-down control signal GZi generating block.

All the GZi should be high at offset compensation of GZi. However, it should be high at the read operation the only sense amplifier selected by the column decoder. The reference numeral CMP designates a control signal for activation of GZi at offset compensation, and GZ_READ does at the read operation. As illustrated in the FIG. 7, GZi is the operation value of GYi-GZ_READ+CMP.

Figure 7B:
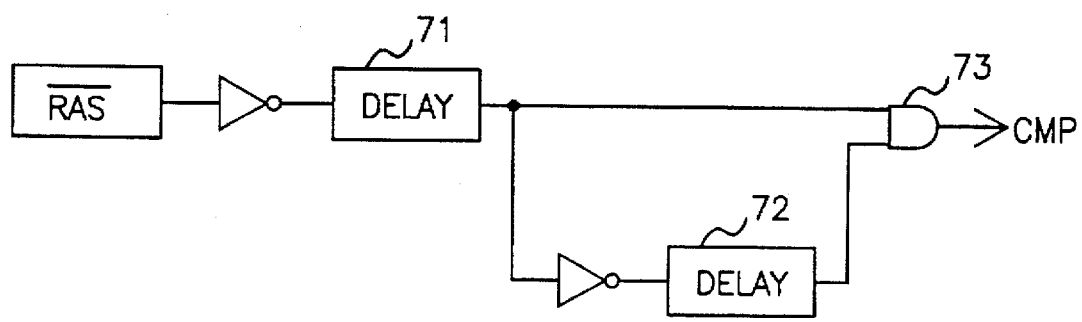
FIG. 7B is a circuit diagram of offset compensation CMP generating block.

FIG. 7B shows the CMP generation block which generates offset compensation CMP. The CMP generation block includes delay circuits 71 and 72, and an AND gate 73. The delay circuit 71 delays the reversed Row Address Strobe /RAS at a predetermined time. The delay 72 delays the reversed output of the delay 71 at a predetermined time. The AND gate 73 AND operates each output of delays 71 and 72 and provides the operation result for CMP. When the RAS signal is activated as low, the signal of CMP shifts from low to high and from high to low after a delay by each of the delay circuits 71 and 72 respectively. Therefore, CMP, which has a time delay of the ) delay circuit 72, is generated.

Figure 7C:
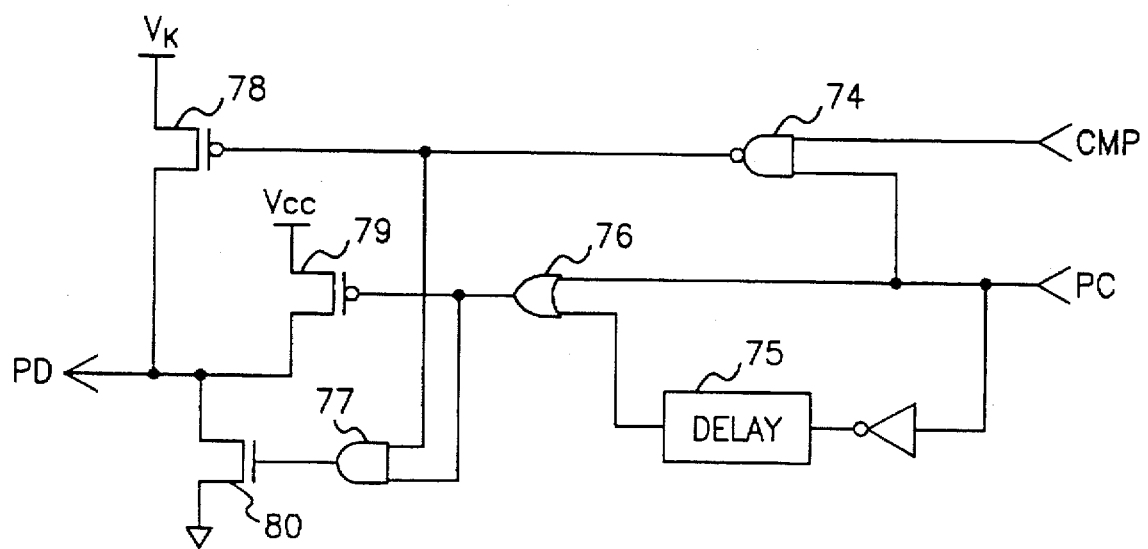
FIG. 7C is a circuit diagram of pull-up driving signal PD generating block.

FIG. 7C shows a circuit diagram of a PD generation block which generates the pull-up driving signal PD. The PD generation block includes a NAND gate 74, a delay 75, an OR gate, an AND gate 77, PMOS transistors 78 and 79, and a NMOS transistor 80, respectively.

The NAND gate NAND operates signals from CMP and PC. The delay 75 delays the reversed PC value, and the OR gate 76 OR operates the signal from the delay 75 and PC. The AND gate 77 AND operates the signals from the NAND gate 74 and the OR gate 76. The PMOS transistor 78 provides $V_k$ for the pull-up driving signal PD according to the output of the NAND gate 74. The PMOS transistor 79 provides $V_{CC}$ for the pull-up driving signal PD according to the output of the OR gate 76. The NMOS transistor 80 provides the ground voltage for the pull-up driving signal PD according to the output of the AND gate 77.

When CMP is activated as high, the pull-up driving signal PD becomes $V_k$. When the precharge control signal PC shifts from high to low, the pull-up driving signal PD is driven as Vcc. The pull-up driving signal PD keeps Vcc for delay time of delay circuit 75 and becomes ground voltage.

Figure 8A:
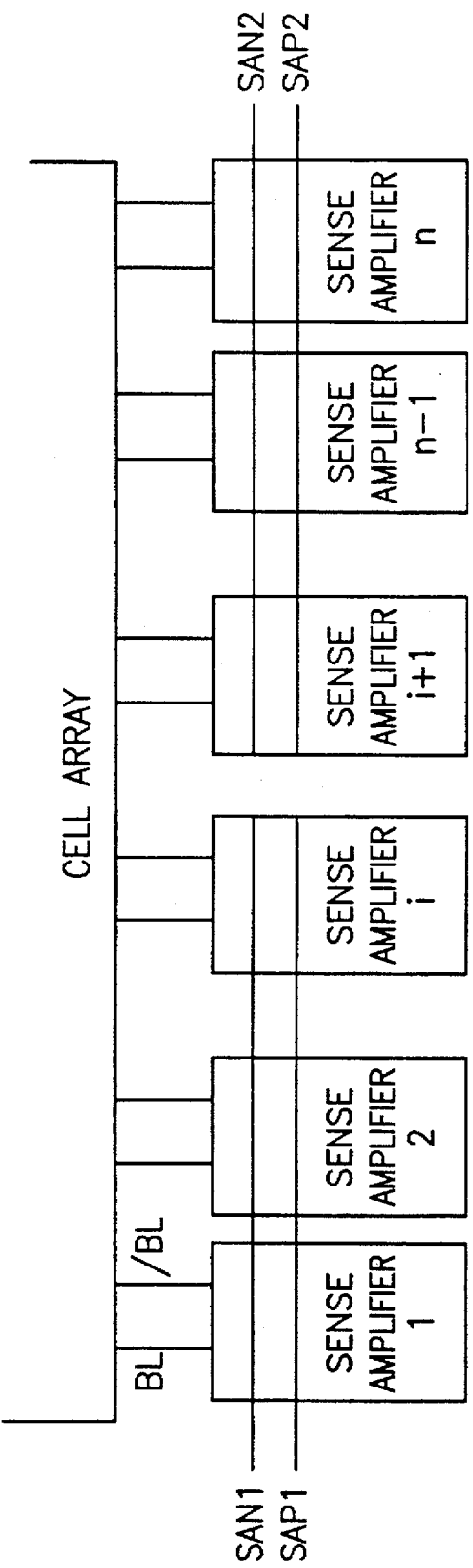
FIG. 8A is a circuit diagram of a regeneration amplifier reducing power line noise which is drived from a sense amplifier.
Figure 8B:
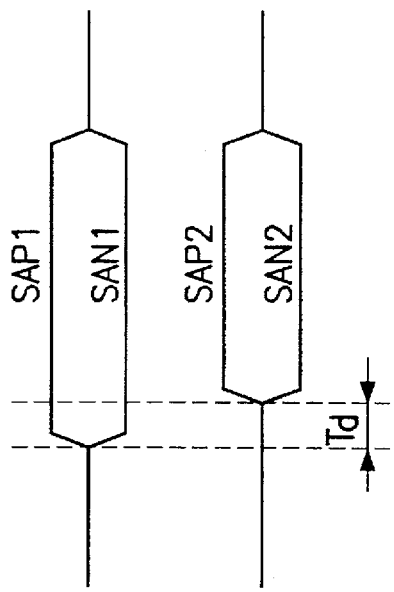
FIG. 8B is a timing diagram of a regeneration amplifier reducing power line noise which is drived from a sense amplifier.

FIG. 8A and FIG. 8B shows a circuit diagram and a timing diagram of regeneration amplifier reducing power line noise which is driven from sense amplifier.

The regeneration amplifier reduces the noise of the power line Vcc & GND by the bit line sense amplifier. A plurality of generation amplifiers perform the operation simultaneously, and a lot of current are provided for Vcc, the bit line and the ground, whereby the voltage of the power line is vibrated.

For reducing the noise from the power line, the control signals SAN and SAP operate at a predetermined time interval. In other words, SAN2 and SAP2 are activated after SAN1 and SAP1 are activated. There is a predetermined time delay Td between activation of the signals. In this method, the noise from the power line is reduced remarkably. For providing a time interval between SAP1 and SAN2, and SAP2 and SAN2, it controls the size of the drivers which drive SAP1 and SAN2, and SAP2 and SAN2.

Therefore, the present invention compensates offset of the sense amplifier from mismatch between transistors, thereby operating stably at high speed on the worst case.

Although the preferred embodiments of the present invention have been disclosed for illustrative purposes, those skilled in the art will appreciate that various modifications, additions and substitutions are possible, without departing from the scope and spirit of the inventions as disclosed in the accompanying claims.

What is claimed is:

1. An apparatus for controlling a bit line sense amplifier having offset compensation, said apparatus comprising:

a first inverting means for inverting data of a first bit line;

a second inverting means for inverting data of a second bit line;

a first and a second switching means responsive to an output signal from a column decoder for switching between an output terminal of said first and said second inverting means and a data bus, respectively;

a third and a fourth switching means responsive to an offset compensation signal for switching between an input terminal and an output terminal of said first inverting means and said second inverting means, respectively; and an offset compensation signal generating means for generating an offset compensation signal in accordance with a row control signal.

2. An apparatus for controlling a bit line sense amplifier as claimed in claim 1, said apparatus further comprising:

a pull-up driving signal generation means for generating a pull-up driving signal;

a pull-down driving signal generation means for generating a pull-down driving signal;

wherein said first and second inverting means further comprises a pull-up transistor and a pull-down transistor, a source of said pull-up transistor being applied to said pull-up driving signal, a source of said pull-down transistor being coupled to ground in accordance with a pull-down driving signal.

3. An apparatus for controlling a bit line sense amplifier as claimed in claim 2, wherein said offset compensation signal generating means makes the offset compensation signal in high state such that data is transferred to said first and said second bit line from data bus when writing.

4. An apparatus for controlling a bit line sense amplifier as claimed in claim 2, wherein said pull-down driving signal generation means makes said pull-down driving signal in low state when writing, and wherein said pull-up driving signal generation means makes said pull-up driving signal in low state when writing.

5. An apparatus for controlling a bit line sense amplifier as claimed in claim 3, wherein said offset compensation signal generating means outputs said offset compensation signal in a low state after a first delay time, and outputs said compensation signal in a high state after a second delay time when a RAS signal is activated as low.

6. An apparatus for controlling a bit line sense amplifier as claimed in claim 5, wherein said offset compensation signal generating means comprises:

a first delay means for delaying said RAS signal for a first period of time:

a second delay means for delaying an output signal of said first delay means for a second period of time; and a first AND operating means for AND operating the output signal of said first delay means and an output signal of said second delay means and outputting the result of AND operation as the offset compensation signal.

7. An apparatus for controlling a bit line sense amplifier as claimed in claim 4, wherein said pull-down driving signal generation means generates said pull-down driving signal which controls for operating either said first inverting means or said second inverting means of said sense amplifier being coupled to said data bus.

8. An apparatus for controlling a bit line sense amplifier as claimed in claim 7, wherein said pull-down driving signal generation means is selected by said column decoder when reading, and generates a pull-down driving signal in a high state when performing offset compensation.

9. An apparatus for controlling a bit line sense amplifier as claimed in claim 4, wherein said pull-up driving signal generation means outputs $V_k$ which equals Vcc minus $V_T$ ($V_T$ is a threshold voltage of a pull-up transistor included in said first and said second inverting means, Vcc is a main power) as a pull-up driving signal when precharging, and the main power Vcc as a pull-up driving signal when performing offset compensation and sensing.

10. An apparatus for controlling a bit line sense amplifier as claimed in claim 9, wherein said pull-up driving signal generating means outputs $V_k$ as a pull-up driving signal when said offset compensation signal is activated as high, outputs said main power as a pull-up driving signal when a precharge control signal which is an inner signal of a memory element is shifted from high to low, and outputs ground power as a pull-up driving signal after keeping said main power as a pull-up driving signal for a fixed time.

11. An apparatus for controlling a bit line sense amplifier as claimed in claim 10, wherein said pull-up driving signal generating means further comprises a NAND operating means for performing NAND operation between said offset compensation signal and said precharge control signal;

a fourth delay means for delaying invert signal of said precharge signal for a fixed time;

an OR operating means for performing OR operation between said precharge control signal and said fourth delay means;

a second AND operating means for performing AND operation between said NAND operating means and said OR operating means;

a first transistor which outputs said $V_k$ as a pull-up driving signal in accordance with output value of said NAND operating means;

a second transistor which outputs said main power as a pull-up driving signal in accordance with output value of said OR operating means; and a third transistor which outputs said ground as a pull-up driving signal in accordance with output value of said second AND operating means.

12. An apparatus for controlling a bit line sense amplifier as claimed in claim 11, further comprising a precharging means for precharging said first bit line and said second bit line in accordance with said precharge signal.

13. An apparatus for controlling a bit line sense amplifier as claimed in claim 12, wherein said precharging means comprises a fifth switching means for switching between said first bit line and said second bit line in accordance with said precharge control signal.

14. An apparatus for controlling a bit line sense amplifier as claimed in claim 13, wherein said precharging means further comprises:

a half driving voltage applier;

a sixth switching means between said first bit line and half driving voltage applier in accordance with said precharge control signal; and a seventh switching means between said second bit line and a half driving voltage applier in accordance with said precharge control signal.

15. An apparatus for controlling a bit line sense amplifier which has a sensing and amplifying means, said apparatus comprising:

a first inverting means for inverting data from a first bit line;

a second inverting means for inverting data from a second bit line;

a first and a second switching means for switching between an output terminal of said first and said second inverting means and a data bus in accordance with an output signal of a column decoder; and a third and a fourth switching means for switching between an input terminal and an output terminal of said first and said second inverting means in accordance with an offset compensation signal.

16. A method for controlling a bit line sense amplifier which has a first and a second inverting means for inverting an output signal of a first and a second bit line; and a first and a second switching means for switching between an input terminal and an output terminal of said first and said second inverting means in accordance with an offset compensation signal, said method comprising steps:

precharging said bit lines;

compensating offset by switching said first and said second switching means which switches said input terminal and said output terminal of said first and said second inverting means respectively; and amplifying a voltage of a bit line which is connected to cells that is activated by a word line, and maintaining input/output voltage of the other bit line after performing offset compensation.

17. A method for controlling a bit line sense amplifier as claimed in claim 16, wherein first and said second pull-up driving voltage equals a main voltage minus a threshold voltage of a pull-up transistor of said first and second inverting means.

18. A method for controlling a bit line sense amplifier as claimed in claim 17, wherein said pull-up driving voltage is main power when offset compensation and sense amplifying.

19. A method for controlling a bit line sense amplifier as claimed in claim 16, wherein said first and said second inverting means is inactivated when writing.

20. A method for controlling a bit line sense amplifier as claimed in claim 17, wherein offset compensation signal is generated such that data from said data bus is provided to said bit line.

* * * * *